United States Patent [19]

Ohdate

[11] Patent Number: 5,043,301

[45] Date of Patent: Aug. 27, 1991

[54] METHOD OF THERMALLY TREATING SEMICONDUCTOR WAFERS IN FURNACE AND WAFER HANGER USEFUL THEREIN

[75] Inventor: Mituo Ohdate, Fukuoka, Japan

[73] Assignee: Mitsubishi Denki Kabushiki Kaisha, Tokyo, Japan

[21] Appl. No.: 554,387

[22] Filed: Jul. 19, 1990

Related U.S. Application Data

[62] Division of Ser. No. 424,826, Oct. 20, 1989, Pat. No. 4,966,549.

[30] Foreign Application Priority Data

Jul. 11, 1989 [JP]  Japan .................................. 1-178424

[51] Int. Cl.[5] ........................................... H01L 21/324
[52] U.S. Cl. .................................... 437/247; 29/25.01; 29/25.02
[58] Field of Search ............. 437/247; 29/25.01, 25.02

[56] References Cited

U.S. PATENT DOCUMENTS

| | | | |
|---|---|---|---|
| 1,515,104 | 5/1985 | Lee ................................. | 432/253 X |
| 4,127,969 | 12/1978 | Hoshi et al. ..................... | 51/283 R |
| 4,317,522 | 3/1982 | Garrett ............................ | 211/41 X |
| 4,566,839 | 1/1986 | Butler ............................. | 432/259 X |
| 4,802,842 | 2/1989 | Hirayama ........................ | 432/253 X |

FOREIGN PATENT DOCUMENTS 61-186231  3/1986  Japan .
0172325  8/1987  Japan ................................. 29/95.02

Primary Examiner—Olik Chaudhuri
Assistant Examiner—Long Pham
Attorney, Agent, or Firm—Oblon, Spivak, McClelland, Maier & Neustadt

[57] ABSTRACT

A wafer hanger has a rod member and a supporting member. The rod member is inserted into respective notches formed in semiconductor wafers, and then placed on the supporting member. The wafer hanger holding the wafers is put into a furnace for heat treatment of the wafers. Since the wafers are hung from the rod member, plastic deformation due to the gravity of the wafers is not caused in the wafers.

3 Claims, 11 Drawing Sheets

METHOD OF THERMALLY TREATING SEMICONDUCTOR WAFERS IN FURNACE AND WAFER HANGER USEFUL THEREIN this is a division, of application Ser. No. 07/424,826, filed on Oct. 20,1989 now Pat. No. 4966549.

BACKGROUND OF THE INVENTION

1. Field of the Invention

The present invention relates to a method of thermally treating semiconductor wafers in a furnace and a tool for holding the semiconductor wafers in the furnace. The present invention also relates to a semiconductor wafer having a shape suitable for the thermal treatment of the semiconductor wafer.

2. Description of Background Arts

As well known in the field of semiconductor technology, semiconductor devices are obtained by fabricating electronic elements and wiring structures on a semiconductor wafer and then splitting the semiconductor wafers into tips. In fabricating the various electronic structures on the semiconductor wafer, the wafer is thermally treated in a furnace for impurity diffusion, thermal oxidation or the like.

Figure 19:
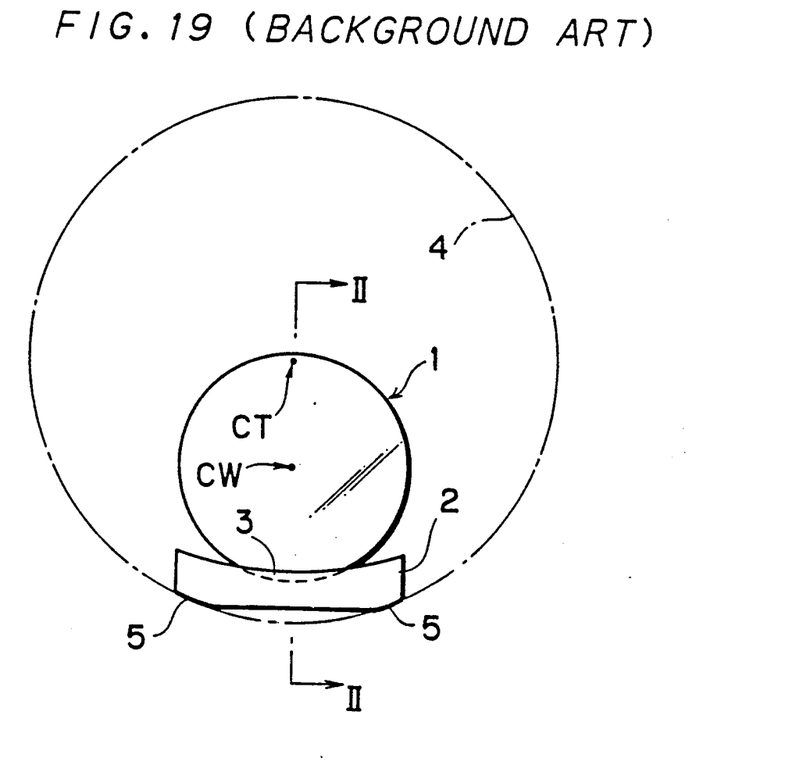
FIG. 19 illustrates a wafer boat which is conventionally used as a wafer holder.
Figure 20:
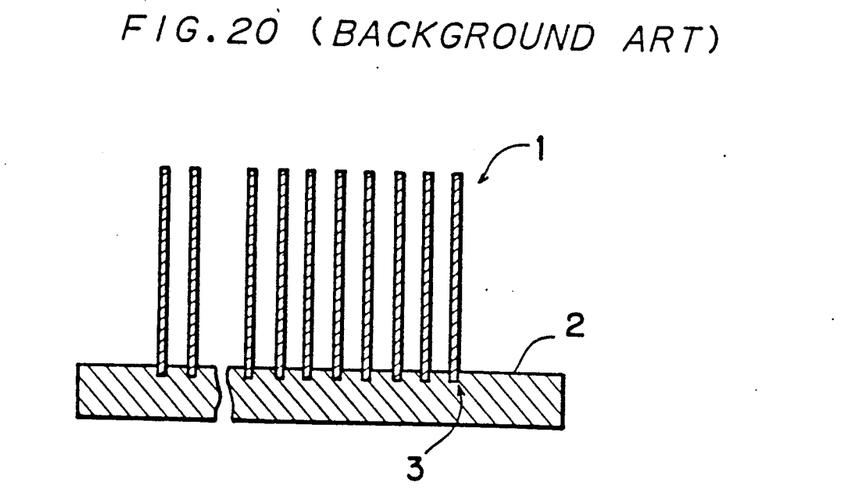
FIG. 20 is a sectional view taken along a line II—II in FIG. 19.

FIG. 19 illustrates wafer boat 2 holding semiconductor wafers 1 thereon, and a sectional view taken along a line II—II is illustrated in FIG. 20. The boat 2 is a block of quartz or polysilicon having a shape of a shallow gutter, and a periodic array of grooves 3 are formed thereon. Respective bottom edges of the wafers 1 are inserted into the grooves 3, thereby the large number of the standing wafers 1 are supported by the boat 2. The boat 2 has chamfers 5 at respective bottom edges thereof, which fit to the inner surface 4 of a heater tube in the furnace.

In the case where the wafers 1 held with the boat 2 are subjected to a heat treatment in the furnace, the following problems are caused.

Figure 21:
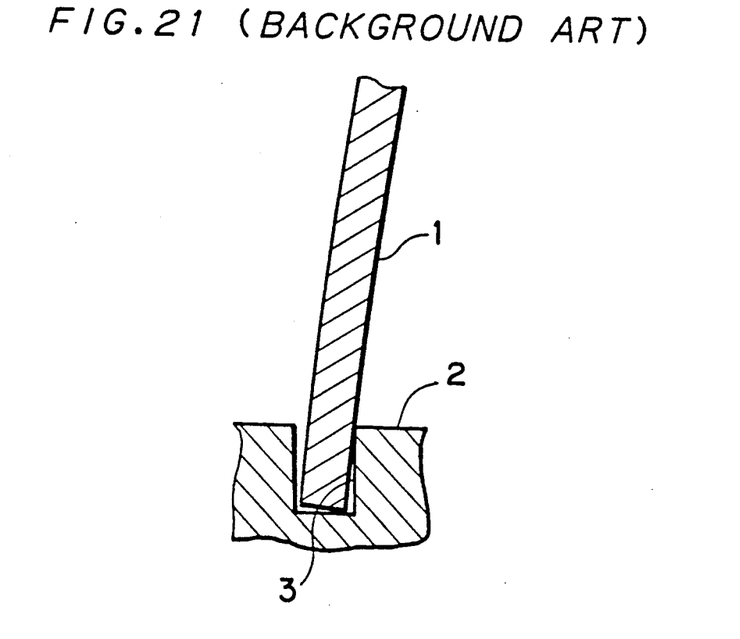
FIG. 21 is an explanatory view of a wafer showing plastic deformation of the wafer.

One of the problems is plastic deformation of the wafers 1 due to the gravity thereof. As shown in FIG. 21 which is a partial enlarged view of FIG. 20, the width of the grooves 3 is set at a value larger than the thickness of the wafers 1 so that the inner walls of the grooves 3 may not compress the Wafers 1 when the wafers 1 and the boat 2 are thermally expanded in the furnace. Accordingly, the wafers 1 stand on the boat 2 while being somewhat inclined due to the gap or clearance between the wafers and the inner walls of the grooves 3. When the heat treatment of the wafers 1 held by the boat 2 is conducted for a long time, plastic deformation of the wafers 1 is caused by the gravity thereof. Therefore, the wafers 1 subjected to the heat treatment become deformated ones, and accuracy in work and positional adjustment of a mask is decreased in the following processes such as lapping, epitaxial growth and photo lithography. As a result, the fraction defective in semiconductor devices obtained from the wafers 1 is increased.

In particular, the plastic deformation is relatively large in wafers having large diameters, and the fraction defective becomes large in proportion to the deformation. Furthermore, even if the diameters of wafers are not so large, the plastic deformation becomes relatively large under the condition that the thickness of the wafers is small.

Another problem of the prior art relates to a holding position of the wafers 1. Since the boat 2 is placed at a position close to the inner bottom surface of the heater tube, the center points CW of the wafers 1 (FIG. 19) are inevitably located at a position which is considerably lower than the center point CT of the inner space of the furnace. In the case where the heat treatment of the wafers 1 in the furnace is conducted for diffusing impurities into the wafers 1, residual impurities and dusts are often deposited on the inner bottom surface of the heater tube. The residual impurities and the dusts go up into the air due to the air current caused by frictional movement of the boat 2 on the bottom surface, when the boat 2 holding the wafers is put into the heater tube. Consequently, the residual impurities and the dusts randomly adhere to the surfaces of the wafers 1 which are held at the low positions. When the wafers 1 are subjected to the heat treatment, non-uniformity of heat treatment such as deviation in the density distribution of impurities and an abnormal diffusion is caused by the adhered residual impurities and dusts. As a result, the electric character of the wafers 1 is deteriorated and the fraction defective thereof is increased.

Figure 22:
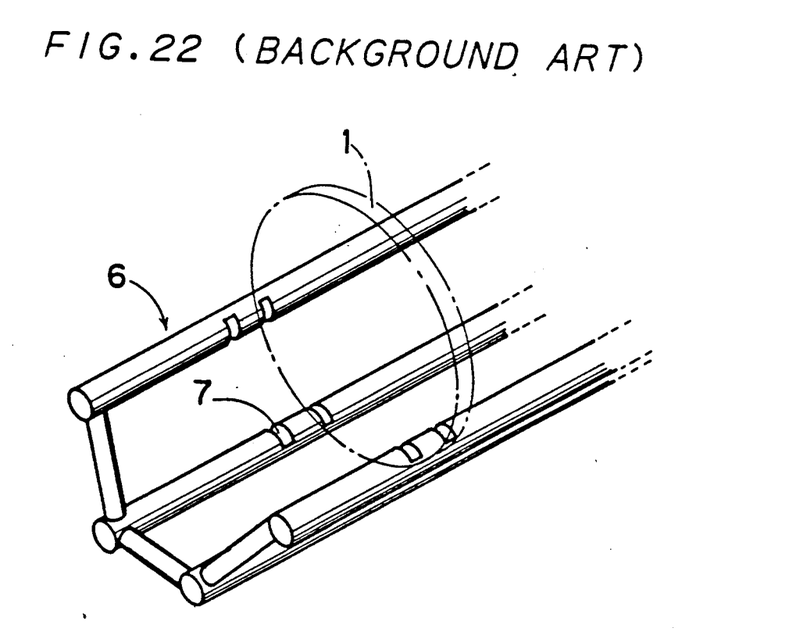
FIG. 22 illustrates another conventional wafer holder.

FIG. 22 illustrates another conventional holder 6 for holding the wafers 1 in a furnace. The holder 6 is constructed by connecting four rod members having notches 7 with each other, and the wafers 1 are held in the holder 6 with respective edges being inserted into the notches 7. In further another holder, which is not illustrated in the drawings the wafers 1 are held by the holder in the state where the wafers are stacked in the vertical direction with spaces therebetween. Respective major surfaces of the wafers are in horizontal planes and respective edges of the wafers 1 are inserted into notches formed in the holder.

Although the constructions of these holders are different from that of the boat 2 shown in FIG. 19 and FIG. 20, the above-indicated problems still remain since plastic deformation is caused in the wafers and the holding positions of the wafers 1 are close to the bottom surface of a heater tube.

SUMMARY OF THE INVENTION

The present invention is directed to a method of thermally treating semiconductor wafers by heating the wafers in furnace having a heating space. According to the present invention, the method comprises the steps of: (a) hanging the wafers from a wafer hanger; (b) putting the wafer hanger holding the wafers into the heating space of the furnace; and (c) supplying a heating power to the furnace, to thereby heat the wafers hung by the wafer hanger.

The wafer hanger may have a hanging portion from Which the wafers are hung and a supporting portion supporting the hanging portion.

Preferably, the step (b) includes the step of: (b-1) placing the wafer hanger holding the wafers in the heating space such that respective center points of the wafers are substantially held at a center level of the heating space.

Since the wafers are hung by the wafer hanger, plastic deformation due to the gravity of the wafers is not caused in the wafers. Consequently, a positional adjustment of a mask or the like in the processes following the heat treatment can be conducted at a high accuracy.

Furthermore, residual impurities or dusts hardly adhere to the wafers, because the wafers are at the center level of the heating space. The wafers can uniformly receive the heat radiation from respective areas of heating means such as a heating tube. Therefore, uniform heat treatment of the wafers is attained.

The present invention is also directed to wafer hanger useful for hanging semiconductor wafers therefrom in a furnace in order to thermally treat the wafers. According to the present invention, the wafer hanger comprises: (a) a rod member capable of being inserted into respective engage holes formed in edge portions of the wafers; and (b) a supporting member for supporting the rod member in a horizontal direction at both end portions of the rod member, wherein the rod member is separatable from the supporting member, and the rod member and the supporting member are made of a material resistant to a temperature for a heat treatment of the wafers in the furnace.

The "engage hole" may be a notch which is tapered off toward the opening thereof, or alternatively, may be a through hole. In both cases, the engage hole engages with the rod member, when the rod member is inserted into the engage hole in order to hang the wafers from the rod member. That is, the term of "an engage hole" in the present invention is a generic one, and includes a hole having a side opening as well as a hole having no side opening. Since the rod member is separatable from the supporting member, the process of hanging the wafers by the rod member and that of removing the wafers from the rod member are easily attained.

In an aspect of the present invention, a wafer hanger comprises: (a) a rod portion having a linear array of tapered notches which are aligned in an axial direction of the rod portion, each of the tapered notches having an opening those width is larger than respective thickness of the wafers and a bottom whose width is smaller than the respective thickness, the rod portion being made of a first material which is resistant to a temperature for a heat treatment of the wafers and has a thermal expansion coefficient smaller than a thermal expansion coefficient of the wafers; and (b) a supporting portion supporting the rod portion in a horizontal direction both ends of the rod portion and being made of a second material resistant to the temperature for the heat treatment, wherein the wafers can be hung from the wafer hanger by inserting respective end portions of the wafers into the tapered notches, respectively.

Since the thermal expansion coefficient of the rod portion is smaller than that of the wafers, the tapered notches catch the wafers with relatively large forces when the wafer hanger holding the wafers is heated. Consequently, the wafers hardly fall down from the rod portion.

The present invention is further directed to a semiconductor wafer having a shape suitable for heat treatment thereof. The wafer has first and second major surfaces opposite to each other and a side edge surface defining respective contours of the first and second major surfaces.

According to the present invention, a notch which is tapered off toward an opening of the notch is formed in the wafer such that the opening is on the side edge surface, and the first and second major surfaces are seleotively cut away at a region corresponding to the notch.

The wafer can be hung by a wafer hanger having a rod member for the heat treatment thereof. The notch can be also used for indicating the orientation of the wafer, and therefore, an orientation flat is not necessary in the Wafer. Since the notch is smaller than the conventional Orientation flat, most of the major surface of the wafer can be utilized for fabricating semiconductor elements therein.

Accordingly, an object of the present invention is to provide a method of thermally treating semiconductor wafers without causing plastic deformation in the wafers.

Another object is to prevent non-uniformity in heat treatment of wafers.

Another object is to provide wafer hangers useful for hanging wafers in a furnace.

Another object is to provide a wafer whose shape is suitable for being hung in a furnace and having advantages in obtaining semiconductor devices therefrom.

These and other objects, features, aspects and advantages of the present invention will become more apparent from the following detailed description of the present invention when taken in conjunction with the accompanying drawings.

BRIEF DESCRIPTION OF THE DRAWINGS

FIG. illustrates a wafer hanger useful in heat treatment Of semiconductor wafers according to a preferred embodiment of the present invention.

DESCRIPTION OF PREFERRED EMBODIMENTS

Figure 1:
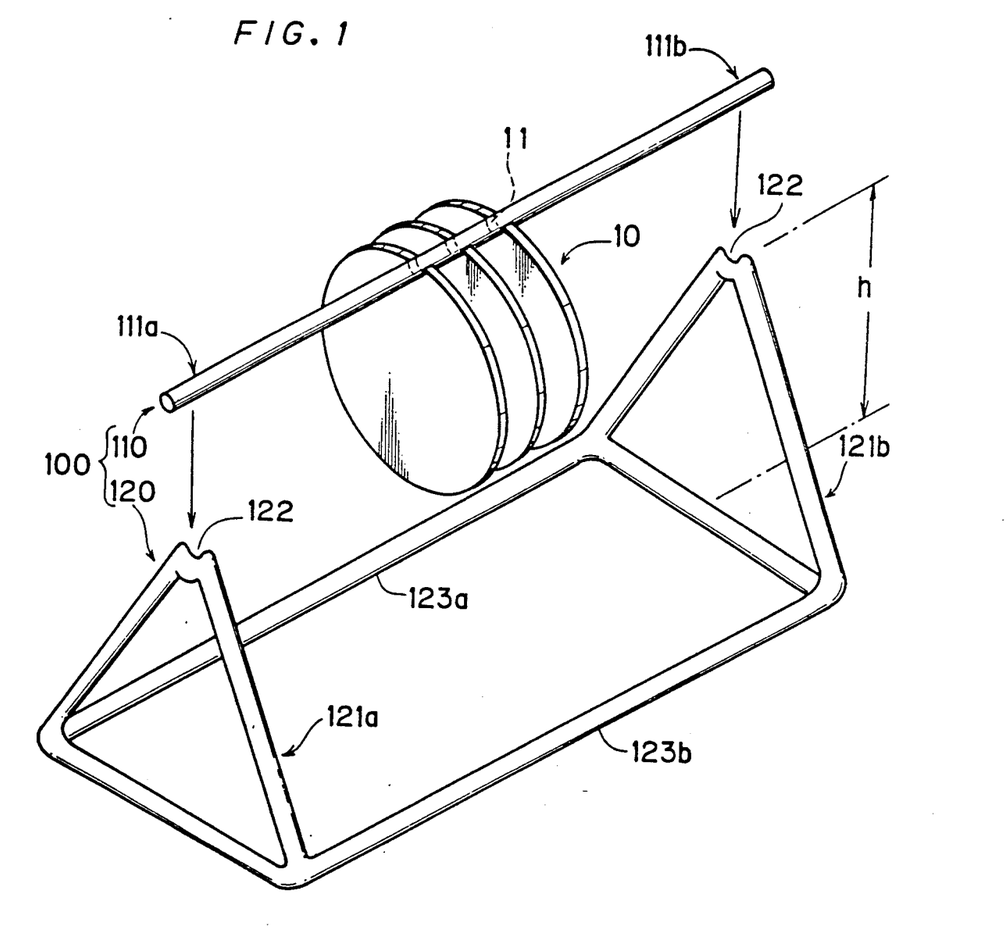

Referring to FIG. 1, there is shown a wafer hanger 100 serving as a holder for holding semiconductor wafers in a furnace with which heat treatment of the wafers according to a preferred embodiment of the present invention is conducted. The hanger 100 comprises a round rod member 110 and a supporting member 120 for supporting the rod member 110 in a horizontal direction by receiving the both edge portions 111a and 111b of the rod member 110.

The supporting member 120 has a pair of triangle stand portions or frames 121a and 121b standing upward and a pair of horizontal rod portions 123a and 123b connecting the triangle foot portions 121a and 121b with each other at the bottom apexes of the triangle stand portions 121a and 121b. The triangle stand portions 121a and 121b are united with the horizontal rod portions 123a and 123b. At respective top apexes of the triangle stand portions 121a and 121b, U-shaped recesses 122 are formed in order to receive the both edge portions 111a and 111b of the rod member 110 therein. The rod member 110 can be attached to and detached from the supporting member 120 as desired.

The whole of the wafer hanger 100 is made of a material resistant to a heat or temperature which is applied to semiconductor wafers during the heat treatment thereof. The temperature for the heat treatment of the wafers 10 is in the range 1100–1500° C., and the wafer hanger 100 is made of quartz or silicon carbide (SiC), for example.

Figure 2A:
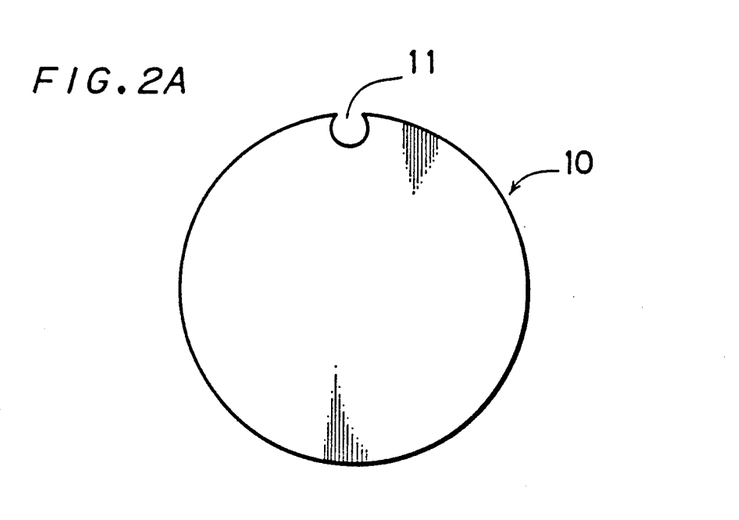
FIG. 2A is a plane view of a semiconductor wafer having a shape suitable for being hung by the wafer hanger shown in FIG. 1.
Figure 2B:
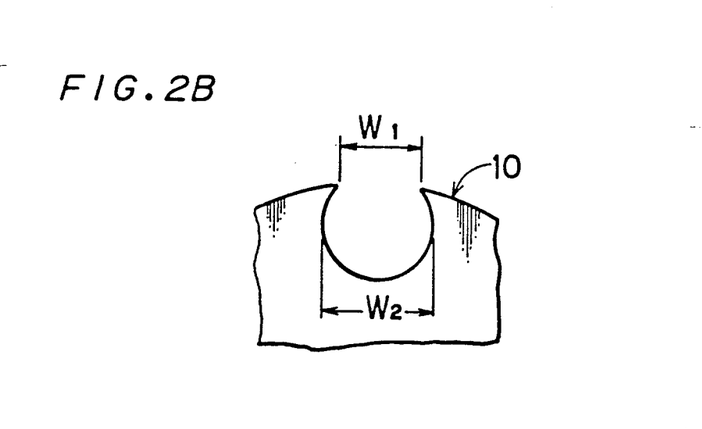
FIG. 2B is an enlarged view of a notch formed at the edge portion of the wafer.

A notch 11 is shaped in an edge portion of each wafer 10 which is hung by the hanger 100. FIG. 2A is a plane view of the wafer 10, and FIG. 2B is a partial enlarged view thereof The notch 11 has the shape of an imperfect circular hole on each of the major surfaces of the wafer 10, and the respective major surfaces are selectively clipped out at a region corresponding to the notch 11. The notch 11 has a side opening on the edge of the wafer 10, and the diameter $W_2$ of the imperfect circular hole is somewhat larger than the diameter of the round rod member 110 shown in FIG. 1. The width $W_1$ of the side opening is smaller than the diameter $W_2$ of the imperfect circular hole. In other words, the hollow space in the notch 11 is tapered off toward the side opening of the notch 11. Furthermore, the width $W_1$ of the side opening is smaller than the diameter of the rod member 110.

Figure 3:
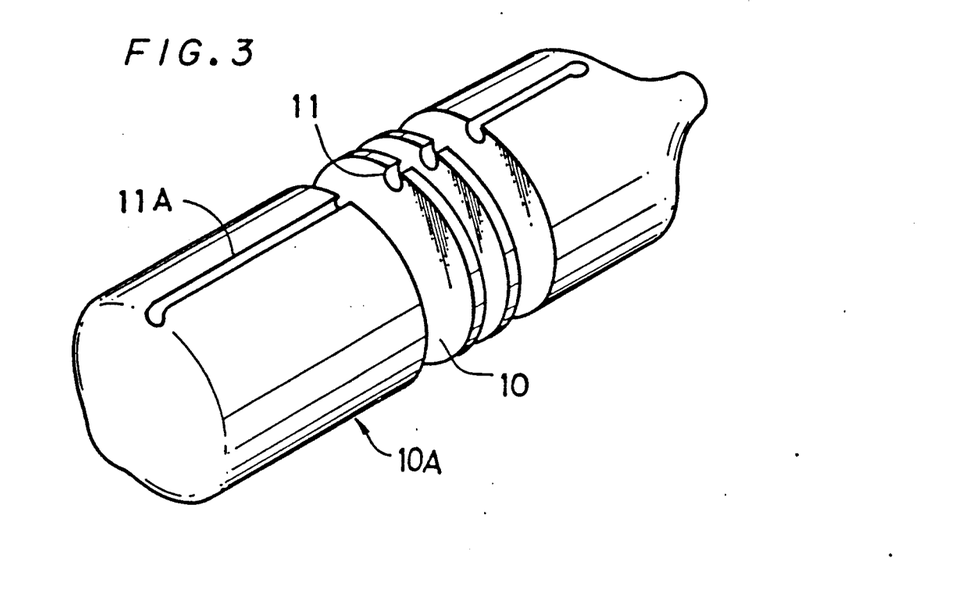
FIG. 3 is a perspective view of a semiconductor ingot from which wafers having notches are obtained.

The process of shaping the notch 11 may be as follows: As shown in FIG. 3, a single crystal ingot 10A of a semiconductor material (e.g., silicon) is prepared, and a groove 11A extending in the longitudinal direction of the ingot 10A is formed thereon through a cutting process with a grinder. The ingot 10A is then cut and divided into a plurality of wafers, whereby the wafers 10 each having a notch 11 is obtained. Alternatively, the notch 11 may be shaped with an ultrasonic punching machine.

Referring to FIG. 1 again, the rod member 110 is detached form the supporting member 120 prior to the heat treatment of the wafers co. The rod member 110 is inserted into respective notches of the wafers 10, whereby the wafers 10 are hung from the rod member 110. Although only three wafers 10 are shown in FIG. 1 for convenience of illustration, a lot of wafers, e.g., twenty five wafers, may be hung from the rod member 110 in practice. In order that sufficient heat is supplied to respective major surfaces of the wafers the wafers are arranged with spaces therebetween. Then, the rod member 110 holding the wafers 10 is placed on the supporting member 120 so that the U-recesses of the triangle foot portions 121a and 121b may receive the end portions and 111b of the rod member 110. The preparation for putting the wafers 10 into a furnace is now completed.

Figure 4A:
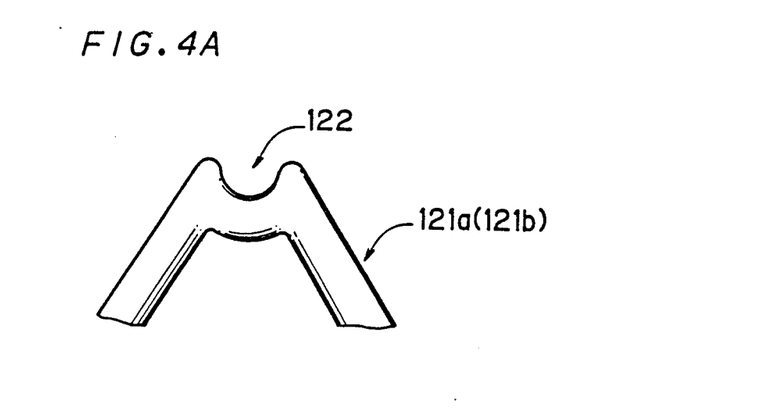
FIG. 4A through FIG. 4C illustrate examples of the top shape of a triangle stand portion of a supporting member.
Figures 4B, 4C:
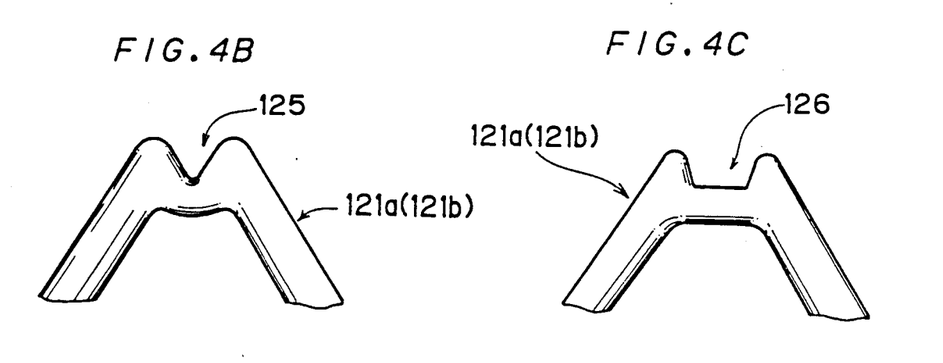

Preferably, the height h of the U-recesses 122 as measured from the bottom position of the wafer hanger 100 is larger than the diameter of the wafer 10 so that the wafers 10 being hung by the wafer hanger 100 may not contact the working desk on which the wafer hanger 100 is planed. The structure for receiving the end portions 111a and 111b of the rod member 110 thereon may be another structure than the U-recesses 122 shown in FIG. 1 and FIG. 4A. For example, a V-recess 125 shorn in FIG. 4B or a recess 126 having a flat bottom shown in FIG. 4C may be employed.

Figure 5:
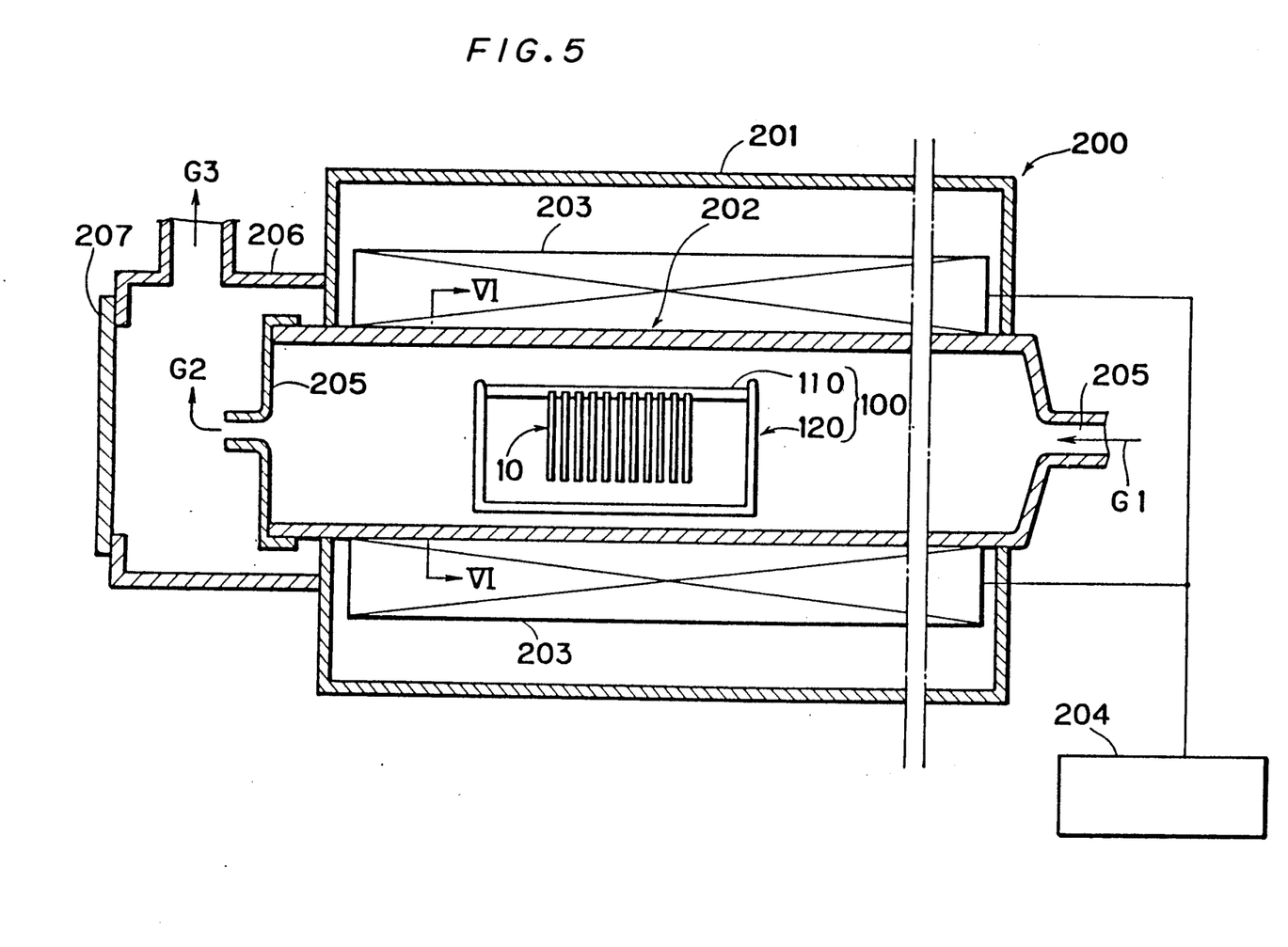
FIG. 5 illustrates a furnace in which the wafer hanger holding the wafers is placed.
Figure 6:
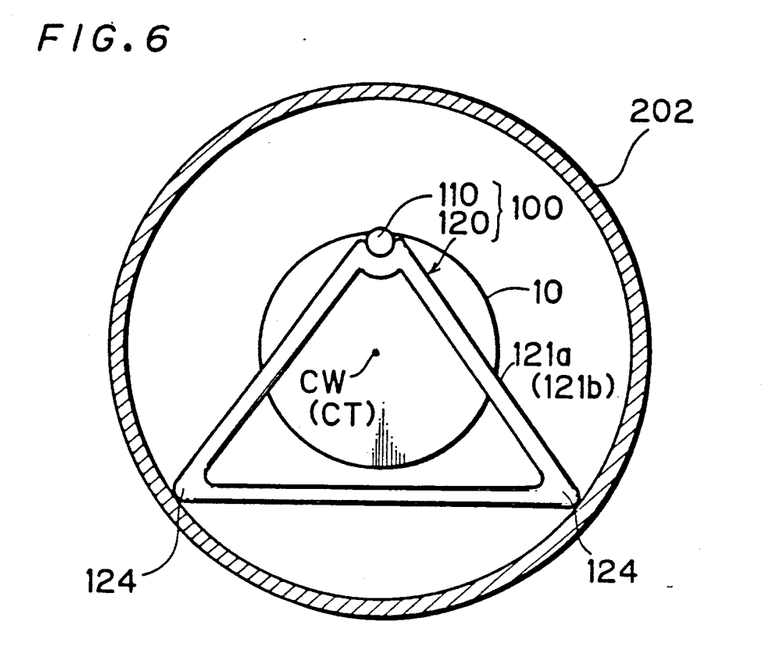
FIG. 6 is a sectional view taken along a line VI—VI in FIG. 5.

Then, the wafer hanger 100 holding the wafers 10 is put into a furnace. FIG. 5 illustrates the internal structure of a furnace 200 in which the wafer hanger 100 holding the wafers 10 is placed, and FIG. 6 is a sectional view taken along the line VI—VI in FIG. 5. The furnace 200 comprises a heater tube 202 made of quartz or silicon carbide, and has a shape of a lateral cylinder, which is mounted in a housing 201. An electric heater 203 is wound around the heater tube 202, and the heater 203 generates a heat by receiving an electric power from an electric power controller 204.

In the case where the heat treatment of the wafers 10 are conducted in order to thermally diffuse gallium atoms into the wafers 10, the temperature in the heater tube 202 is maintained at 1250° C., for example. A gas G1 including gallium oxide ($Ga_2O_3$) and hydrogen ($H_2$) is supplied from an opening 205 of the heater tube 202 to the inner space of the tube 202. Gallium atoms are thermally dissociated from gallium oxide and are diffused into the wafers 10, while the other components go out of the tube 202 as a gas G2 through a hole formed in a cap member 205. Hydrogen and oxygen included in the gas G2 react to each other in a duct 206, to become an exhaust gas G3. The cap member 205 is removed and a door 207 is opened before and after the heat treatment so that the wafer hanger 100 holding the wafers 10 can be put into and taken out from the tube 202.

In general, the heat treatment of the wafers 10 is conducted for a long time, e.g., three hours at minimum and fifty hours at maximum, and wafers 10 are held in the tube 202 during the heat treatment. However, since the wafers 10 are hung by the wafer hanger 100 during the heat treatment, plastic deformation of the wafers 10 due to the gravity thereof is not caused. Therefore, the flatness of the wafers 10 is well maintained even after the heat treatment so that adjustment errors due to the deformation of wafers 10 are prevented in a masking process and other processes which follow the heat treatment. As a result, the fraction defective of semiconductor devices obtained from the wafers 10 is decreased and the reliability of the semiconductor devices is increased.

As shown in FIG. 6, wafer hanger 100 is placed in the heater tube 202 in the state where the bottom apexes 124 of the triangle stand portions 121a and 121b contact the inner surface of the tube 202. The sizes of the triangle stand portions 121a and 121b are such that the respective center points CW of the wafers 10 are at the center axis CT of the cylindrical inner space of the heater tube 202, and the wafers 10 are held at relatively high level in the heater tube 202 as compared with the conventional case (see FIG. 19). Consequently, even when the residual impurities and the dusts existing on the inner bottom surface of the heater tube 202 go up into the air during the wafers 10 and the wafer hanger are put into and taken out from the heater tube 202, the residual impurities and the dusts hardly adhere to the wafers 10. As a result, abnormal diffusion of impurities into the wafers 10 is prevented in the thermal treatment of the wafers 10. Furthermore, since the distances between the wafers 10 and respective portions of the inner surface of the heater tube 202 are substantially identical to each other, the heat radiation as received at the wafers 10 is substantially isotropic and the degree of the uniformity in the heat treatment of the wafers is increased.

After the heat treatment, the wafer hanger 100 holding the wafers is taken out from the furnace 200. Then, the wafers 10 are detached from the wafer hanger 100 through a procedure reverse to that for hanging the wafers 10.

The notch 11 formed in the wafer 10 has other advantages as well as the advantage that the wafer 10 can be easily hung by the wafer hanger 100. One of them is in that the orientation of the wafer 10 is indicated by the notch 11 and an orientation adjustment of a mask to the wafer 10 in a photolithography or the like is attained by referring to the position of the notch 11 on the wafer 10. Therefore, it is not necessary to form an orientation flat at the edge of the wafer 10 having the notch 11.

Figure 8:
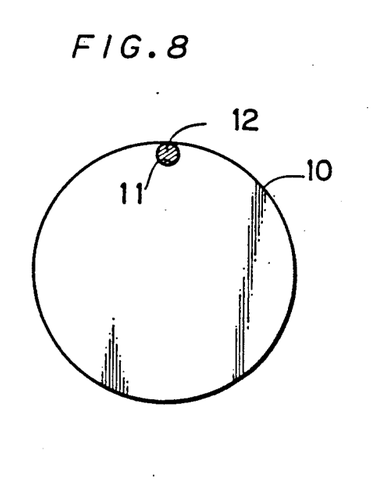
FIG. 8 is a plane view of the wafer having a notch.
Figure 9:
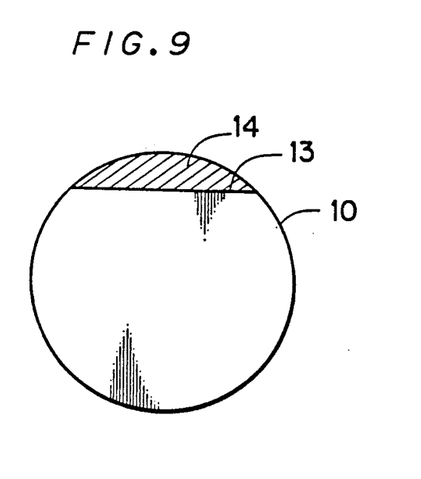
FIG. 9 is a plane view of a wafer having an orientation flat.

The other advantage is in that the utilization factor of the wafer surface is increased, i.e., the utilization factor of the semiconductor material is improved. As shown in FIG. 8, the notch 11 can be formed by removing a small part 12 from the wafer 10. Accordingly, most of the major surface of the wafer 10 can be utilized for forming electronic elements thereon, and a large number of semiconductor tips can be obtained from the wafer 10. On the other hand, if an orientation flat 13 shown in FIG. 9 were formed in the wafer 10, a relatively large part 14 should be removed from the wafer 10 and the number of semiconductor tips obtained from the wafer 10 would be small as compared with the case shown in FIG. 8. Therefore, the notch 11 is desirable in increase of the utilization factor of the wafer surface.

Figure 7:
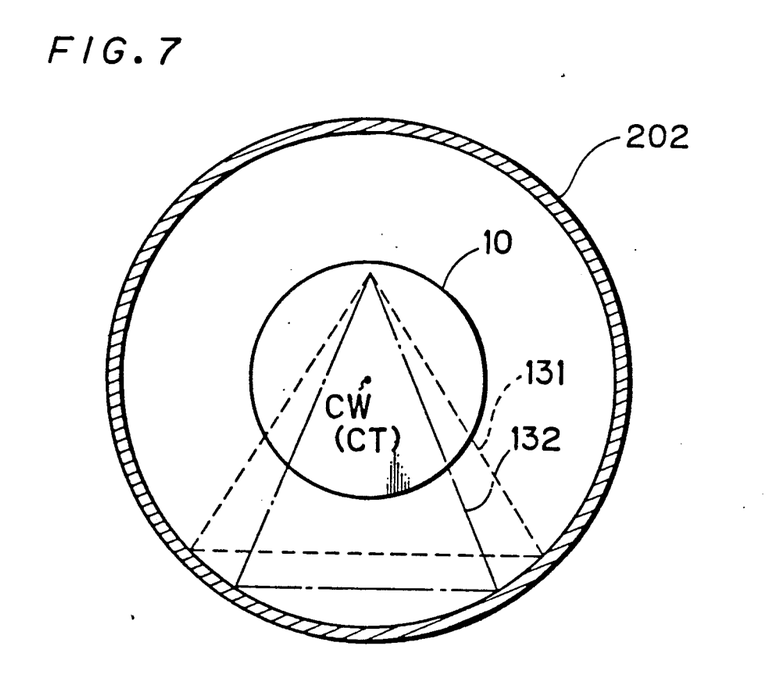
FIG. 7 illustrates modifications of the supporting member.

According to the present invention, the wafer hanger 100 and the wafer 10 may have other instructions in place of those shown in FIG. 1. Examples thereof are as follows:

(1) The shapes and the sizes of the triangular stand portions 121a and 121b may be modified under the condition that the wafer 10 are held at the center space of the heater tube 202. For example, the shapes of the triangular stand portions 121a and 121b may be determined so as to coincide with triangle 131 or 132 shown in FIG. 7. In place of the triangular stand portions 121a and 121b, rectangular stand portions or frames may be provided in the supporting member 120. The present invention is effective even if the center points CW of the wafers 10 are somewhat deviated from the level of the center axis CT of the heater tube 202.

Although it is preferred that the center points CW of the wafers 10 are just at the level of the center axis CT of the heater tube 202, small deviation therebetween is permitted as indicated above. The allowable range of the deviation depends on the difference between respective diameters of the wafer 10 and the cylindrical inner space of the heater tube 202. When the diameter of the heater tube 202 is considerably larger than the diameter of the wafer 10, the distance between the wafer 10 and the inner bottom surface of the heater tube 202 is relatively large, and therefore, abnormal diffusion is effectively prevented even if the deviation is about 20%–30% of the diameter of the wafer 10, for example. On the other hand, if the diameter of the heater tube 202 is relatively small, the shapes of the triangle stand portions 121a and 121b are determined so as to minimize the deviation, preferably to zero.

(2) The shape of the notch 11 may be different from an imperfect circle. In the wafer 10 shown in FIG. 10A and FIG. 10B, the notch 11 has a shape of a trapezoid 15, i.e., a triangle whose top portion is cut away. In order to hang the wafer 10 from the rod member 110 (FIG. 1) without falling-down of the wafer 10, the top width of the trapezoid 15, i.e., the width W3 of the opening of the notch 11, is smaller than the diameter of the rod member and the bottom width W4 of the trapezoid 15 is larger than the diameter of the rod member 110. The notch having the shape of the trapezoid 15 is another example of notches in which the hollow space therein is tapered off toward the opening at the edge of the wafer 10.

Figure 11:
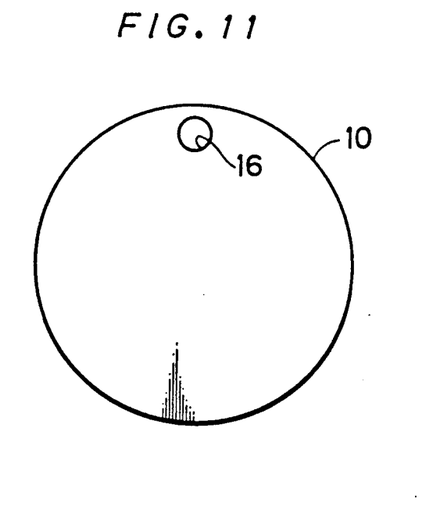
Figure 12:
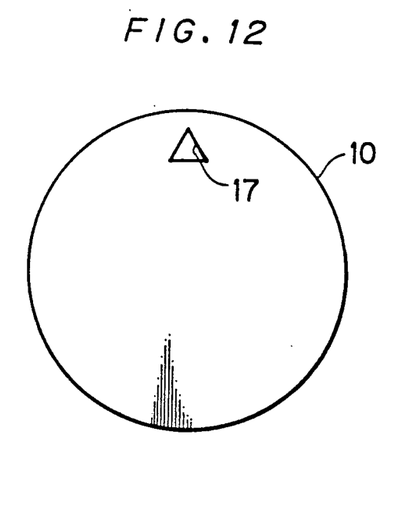

FIG. 11 and FIG. 12 illustrate wafers 10 having a circular through hole 16 and a triangle through hole 17 at the edge portions of the wafers 10, respectively. The respective sizes of the holes 16 and 17 are such that the rod member 110 can be inserted into the hole 16, 17. The hole 16 or 17 is formed in the wafer 10 in place of the notch 11 with an ultrasonic punching machine, for example, and is utilized in the same manner with the notch 11.

Figure 10A:
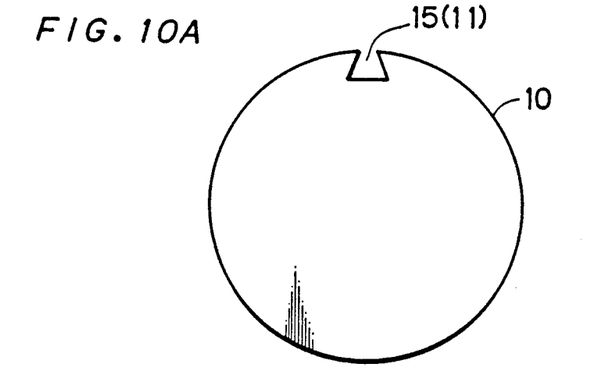
FIG. 10A, FIG. 10B, FIG. 11 and FIG. 12 illustrate various modifications of the wafer.
Figure 10B:
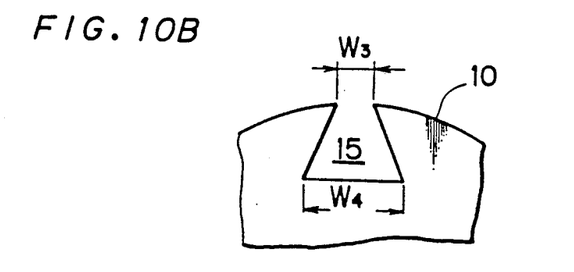

When the wafer 10 is hung from the rod member 110, a part of the inner edge of the hole 16 or 17 engages with the rod member 110. Also in the case one of the notches 11 shown in FIG. 2A and FIG. 10A is formed in the wafer 10, the taper walls of the notch engage with the rod member 110. Therefore, all of the illustrated holes and notches are species under the generic concept of "holes engageable with the rod member 110" or "engage holes." The through holes 16 and 17 are engage holes having no side opening at the edge of the wafer, and the notches are engage holes having side openings at the edge of the wafer.

Within the engage holes 11, 16 and 17, the notch 11 can be formed not only by punching but also by cutting away a portion of the ingot 10A from the outer surface of the ingot 10A, and therefore, the degree of freedom in selecting a means for forming the notch 11 is relatively high. Furthermore, in the case where the notch 11 is utilized as "an orientation notch" in a photolithography or the like, the side opening of the notch 11 is particularly effective in positional adjustment between the wafer 10 and the apparatus for the photolithography. Consequently, the notch is more useful in the positional adjustment than the through holes 16 and 17.

Figure 13:
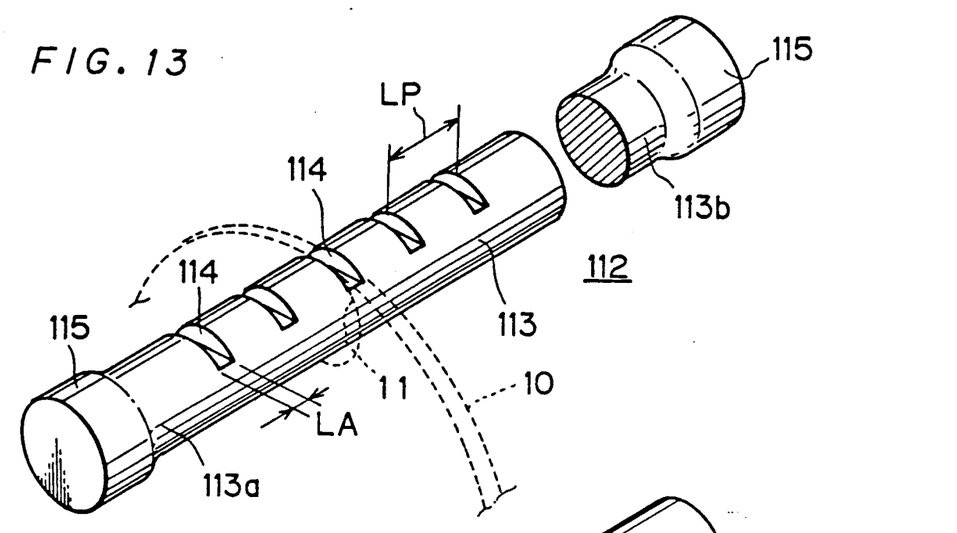
FIG. 13 through FIG. 15 illustrate modifications of rod member used in the wafer hanger.
Figure 14:
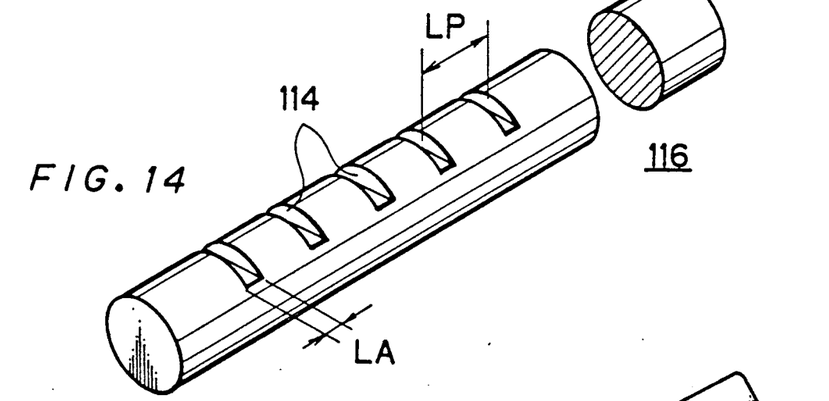
Figure 15:
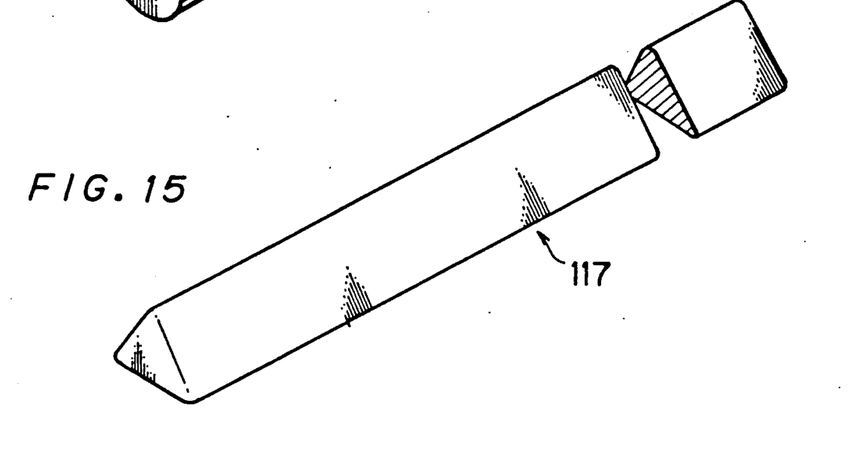

(3) Examples of rod members which can be employed in place of the rod member 110 are illustrated in FIG. 13 through FIG. 15. A rod member 112 in FIG. 13 is such that the diameters of the end portions 115 are larger than the diameter of the central rod portion 113. The parts 113a and 113b of the central bar portion 113 close to the end portions 115 are received by the U-recesses 122 shown in FIG. 1. Consequently, even if an external force is applied to the rod member 112 in the longitudinal direction of the rod member 112 under the condition where the wafers 10 are hung from the rod member 112, the rod member 112 does not fall down from the supporting member 120 since one of the end portions 115 engages with the outer edge of the corresponding U-recess 122. The diameters of the end portions 115 are smaller than the diameter of the notch 11 or the hole 16, 17, so that the rod member 112 can be inserted into the notch 11 or the hole 16, 17.

In the upper surface of the central rod portion 113, a periodic linear array of notches 114 each having a prescribed width LA is formed with an alignment pitch LP, the width LA being somewhat larger than the thickness of the wafer 10. The rod member 112 is inserted into the notch 11 and the notches 11 and 114 are engaged with each other, so that the wafer 10 is hung from the central rod portion 113. Although only one wafer 10 is illustrated in FIG. 13, a number of wafers are hung from the rod member 112 by engaging respective notches with the corresponding notches 114 on the rod member 112. Therefore, when the pitch LP is determined so as to coincide with an optimum alignment pitch of wafers for the heat treatment, the wafers 10 can be easily hung with the optimum pitch. Furthermore, since the wafers are hardly moved in the longitudinal direction of the bar member by an external force, the hanging pitch of the wafers 10 is well maintained at the optimum pitch.

FIG. 14 illustrates a rod member 116 whose shape corresponds to the central rod portion 113 of the rod member 112. A periodic linear array of notches 114 is formed on the rod member 116 similarly to the rod member 112, and wafers 10 are hung therefrom with the pitch LP.

FIG. 15 illustrates a triangle rod member 117, which is useful for hanging the wafer 10 in which the trapezoid notch 11 shown in FIG. 10A or the triangle hole 17 shown in FIG. 12 is formed. When the triangle rod member 17 is employed, it is preferred to employ a supporting member on which the recesses 126 having flat bottoms are formed. In the state where the wafers 10 are hung by the triangle rod member 117, prevented is swing of the wafers 10 around the rod member 117 when the wafer hanger holding the wafers 10 is carried. However, in this case, a force for preventing the swing is applied from the rod member 117 to the wafers 10 in the direction parallel to the major surfaces of the wafers 10. Therefore, if it is required to minimize the force applied to the wafers 10, it is preferred to employ the rod member 110, 112 or 116 having a circular cross section.

Figure 16:
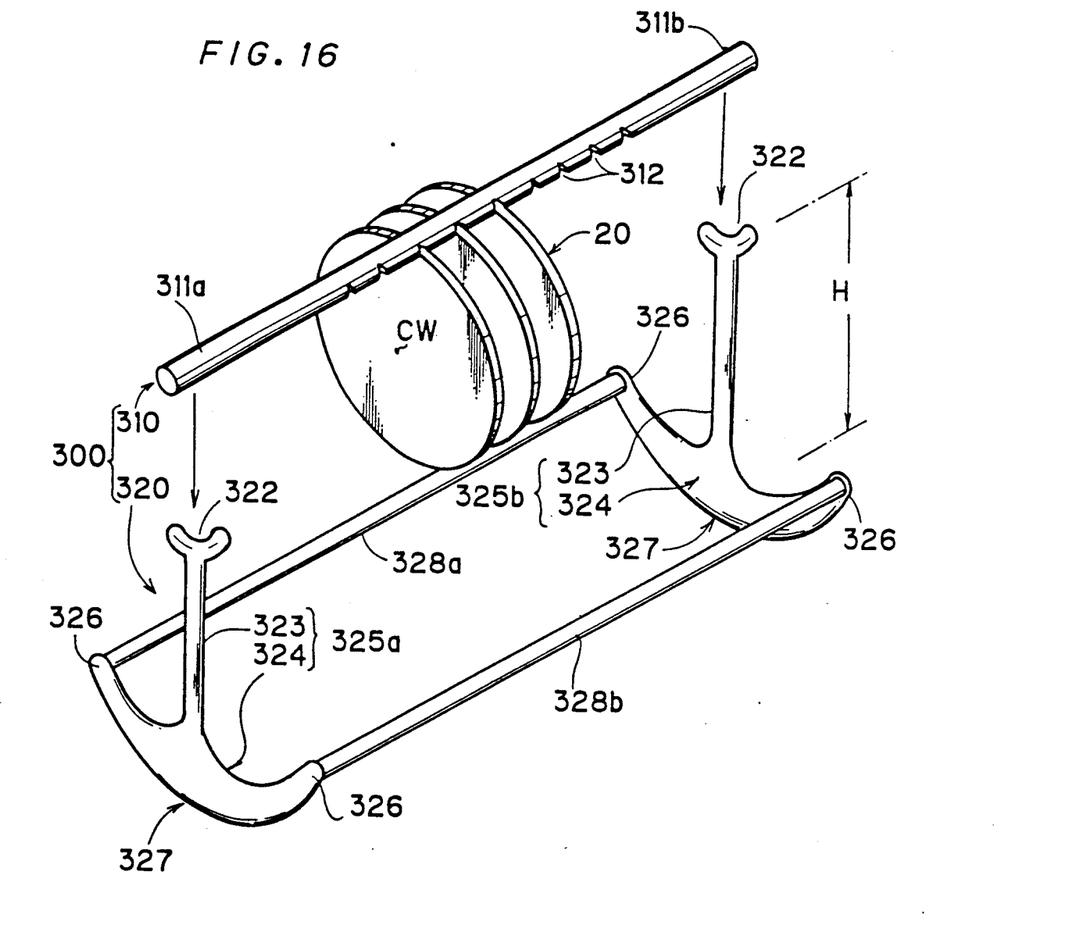
FIG. 16 illustrates another wafer hanger according to the present invention.
Figure 17:
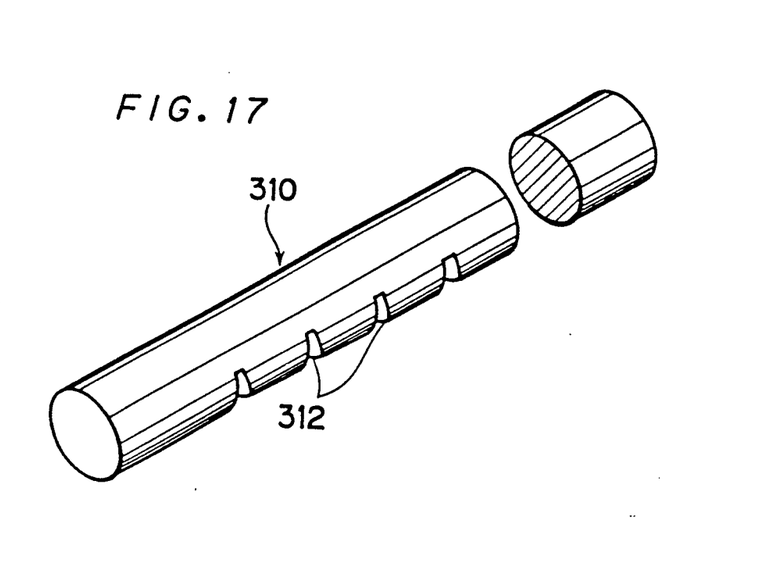
FIG. 17 is a perspective view of a rod member used in the wafer hanger shown in FIG. 16, FIG. 18A and FIG. 18B are partial sections of the rod member showing a principle of catching wafers with tapered notches.

FIG. 16 illustrates another wafer hanger 300 employable in the heat treatment of semiconductor wafers according to the present invention. The wafer hanger 300 consists of a round rod member 310 and a supporting member 320. At the lower surface of the rod member 310, a periodic linear array of tapered notches 312 are formed in the longitudinal direction of the bar member 310 (see FIG. 17). A number of semiconductor wafers 20 are caught in the tapered notches 312 according to a principle hereinafter described, whereby the wafers 20 are hung from the rod member 310, On the other hand, the supporting member 320 has a pair of portions 325a and 325b each having a shape of a standing anchor and a pair of horizontal bar portions 328a and 328b for connecting the anchor portions 325a and 325b with each other. Axial parts 323 of the anchor portions 325a and 325b are standing in the vertical direction, and U-recesses 322 are formed at respective top parts thereof. The bottom edge surfaces 327 of respective arm parts 324 extending from the bottom parts of the axial parts 323 have shapes of arcs which fit the inner bottom surface of the heater tube 202 (FIG. 6). The horizontal rod portions 328a and 328b connect the respective ends 326 of one arm part 324 with those of the opposite arm part 324.

The end portions 311a and 311b of the rod member 310 are received by the recesses 322, so that the rod member 310 holding the wafers 20 is supported horizontally. The height H of the axial parts 323 is larger than the diameter of the wafer 20. Preferably, the height of the axial parts 323 is such that the center points CW of the wafers 70 are substantially at the center axis CT (not shown in FIG. 16) of the heater tube 202 when the wafer hanger 300 holding the wafers 20 is placed in the tube 202. The height of the axial parts 323 is substantially equal to the height of the U-recesses 322 as measured from the bottom edge of the supporting member 320.

The supporting member 320 is made of a material resistant to the heat or temperature applied to the wafers 20 for the heat treatment thereof. In the case where the wafers 20 are silicon wafers 20, the supporting member 320 may be made of quartz, for example. On the other hand, the material of the rod member 310 is selected so as to satisfy not only the first condition that the bar member 310 is resistant to the temperature for the heat treatment but also the second condition that the thermal expansion coefficient of the rod member 310 is smaller than that of the wafers 20, which is $\beta = 4.2 \times 10^{-4} \, K^{-1}$ in the case of silicon wafers. According to these conditions, ceramics may be employed as the material of the rod member 310, for example. Preferably, the rod member 310 is made of aluminum silicate, zircon or zircon-cordierite.

Figure 18A:
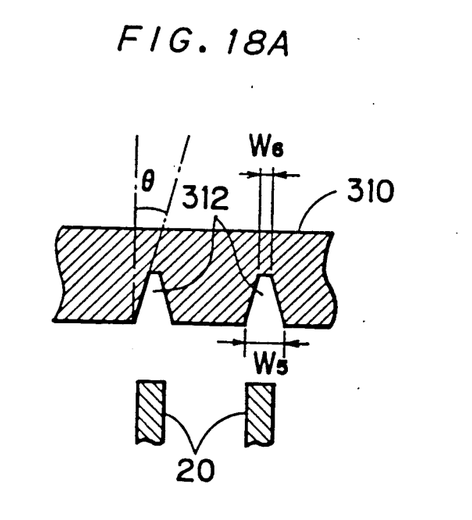

FIG. 18A is a sectional view showing a part of the rod member 310. The width $W_5$ of the tapered notch 312 at the opening thereof is larger than the thickness of the wafer 20, while the width $W_6$ at the bottom of the tapered notch 312 is smaller than the thickness of the wafer 20. The taper angle $\theta$, i.e., the angle at which the inner walls of the notch 312 are inclined, is about 7°.

Figure 18B:
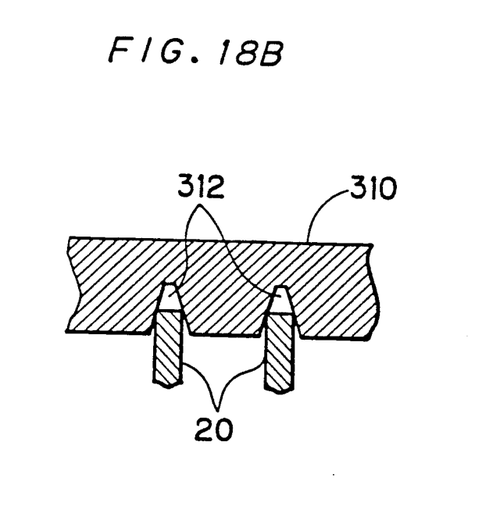

In order to hang the wafers 20 from the wafer hanger 300, the respective edge portions of the wafers 20 are inserted into the tapered notches 312 and pushed toward the bottoms of the tapered notches 312. Through the process, the respective edge portions of the wafers are caught between the inner walls of the notches 312 with elastic forces due to respective elasticities of the wafers 20 and the rod member 310, as shown in FIG. 18B. The rod member 310 catching a number of wafers 20 (twenty five wafers, for example) is placed on the supporting member 320 by inserting the end portions 311a and 311b (FIG. 16) into the U-recesses 322, so that the rod member 310 is supported in the horizontal direction. The wafer hanger 300 holding the wafers 20 is put into the heater tube 202, and the wafers 20 are subjected to the heat treatment therein. The procedure of the heat treatment is similar to that for the wafers 10 hung by the wafer hanger 100 of FIG. 1

In the heat treatment of the wafers 20, the respective temperatures of the wafers 20 and the wafer hanger 300 are increased, and these elements expand with the heat. Since the thermal expansion coefficient of the rod member 310 is smaller than that of the wafers 20, the expansion of the width of the notch 312 (FIG. 18B) is smaller than that of the thickness of each wafer 20. Consequently, the catching force of each wafer 20 between the inner walls of the tapered notch 312 is increased, and the respective wafers 20 hardly fall down from the rod member 310. Similarly to the wafer hanger 100 shown in FIG. 1, plastic deformation and abnormal diffusion in the wafers 20 are prevented since the wafers 20 are hung from the bar member 310 at the center space of the heater tube 202.

The wafer hanger 300 can hold the wafers having no engage holes, and therefore, the process of forming the engage holes is not required. Furthermore, the wafers 20 can be attached to and detached from the wafer hanger 300 even if the wafer hanger 300 is constructed such that the rod member 310 cannot be separated from the supporting member 320. Consequently, a wafer hanger in which the bar member 310 is united with the supporting member 320 is also in the scope of the present invention. In generic terms, the rod member 310 and the supporting member 320 are called as "a rod portion" and "a supporting portion" of a wafer hanger in order to represent both of the separated members and the united one. If the wafer hanger is such that the rod portion and the supporting portion are separatable as the wafer hanger 300 shown in FIG. 16, the wafers 20 are attached to and detached from the wafer hanger more easily than the united one.

Each of the supporting members 120 and 320 is employable in either of the wafer hangers and 300. Therefore, a wafer hanger consisting of the rod member 110 and the supporting member 320 rather than the supporting member 120 can be employable in the present invention.

The present invention can be applied to heat treatment for various processes such as a thermal oxidation of wafers as well as the impurity diffusion process.

Although the present invention has been described and illustrated in detail. it is clearly understood that the same is by way of illustration and example only and is not to be taken by way of limitation. The spirit and scope of the present invention should be limited only by the terms of the appended claims.

I claim:

1. A method of thermally treating semiconductor wafers by heating said wafers in a furnace having a heating space, comprising the steps of:
   (a) hanging said wafers from a wafer hanger;
   (b) putting said wafer hanger holding said wafers into said heating space of said furnace e; and
   (c) supplying a heating power to said furnace, to thereby heat said wafers hung by said wafer hanger;
   wherein said wafer hanger has a hanging portion from which said wafers are hung and a supporting portion supporting said hanging portion; and
   the step (b) includes the step of:
   (b-1) placing said wafer hanger holding said wafers in said heating space such that respective center points of said wafers are substantially held at a center level of said heating space;
   wherein said hanging portion has a horizontal rod; and
   said step (a) includes the step of:
   (a-1) hanging said wafers from said horizontal rod such that said wafers are aligned in a horizontal direction.

2. A method of claim 1, wherein
   each of said wafers has an engage hole at an edge portion thereof, and
   said step (a-1) includes the step of:
   inserting said horizontal rod into respective engage holes of said wafers.

3. A method of claim 1, wherein
   said horizontal rod is made of a material whose thermal expansion coefficient is smaller than a thermal expansion coefficient of said wafers,
   a linear array of tapered notches are formed in said horizontal rod, each of said tapered notches having an opening whose width is larger than a thickness of said wafers and a bottom whose width is smaller than said thickness, and
   the step (a-1) includes the step of:
   inserting respective edge portions of said wafers into said tapered notches, respectively.

* * * * *